United States Patent [19]

Becker

[11] 4,417,393

[45] Nov. 29, 1983

[54] METHOD OF FABRICATING HIGH DENSITY ELECTRONIC CIRCUITS HAVING VERY NARROW CONDUCTORS

[75] Inventor: Charles A. Becker, Rexford, N.Y.

[73] Assignee: General Electric Company, Schenectady, N.Y.

[21] Appl. No.: 249,599

[22] Filed: Apr. 1, 1981

[51] Int. Cl.³ .............................................. H05K 3/46
[52] U.S. Cl. ......................................... 29/846; 29/849; 174/68.5
[58] Field of Search .................. 174/68.5; 29/846, 849

[56] References Cited

U.S. PATENT DOCUMENTS

| B437,450 | 1/1975 | Older et al. | 174/68.5 X |
|---|---|---|---|
| 3,040,213 | 6/1962 | Byer et al. | 174/68.5 X |
| 3,077,511 | 2/1963 | Bohrer et al. | 174/68.5 |
| 3,445,921 | 5/1969 | Leenhouts | 29/846 |
| 3,770,529 | 11/1973 | Anderson | 174/68.5 X |
| 3,791,858 | 2/1974 | McPherson et al. | 174/68.5 X |
| 3,837,074 | 9/1974 | Griff | 174/68.5 X |
| 3,846,166 | 11/1974 | Saiki | 174/68.5 X |
| 4,096,626 | 6/1978 | Olsen et al. | 29/846 |

OTHER PUBLICATIONS

"Laser Drilling of Vias in Dielectric for High Density Multilayer Thick Film Circuits", Cocca and Dakesian, Solid State Technology, Sep. 1978, pp. 62–66.

Primary Examiner—R. R. Kucia
Attorney, Agent, or Firm—Geoffrey H. Krauss; James C. Davis, Jr.; Marvin Snyder

[57] ABSTRACT

Electronics circuits having a relatively high density of relatively narrow conductors therein, are fabricated by cutting a groove into the surface of an insulating layer, as by use of laser machining apparatus and the like, for each conductor. Conductive material is placed into each groove to form each of at least one conductor on each of at least one level of the circuit. A thick film dielectric material is applied, over each insulative layer having at least one conductor embedded therein, to form insulative planes between different planes of conductor. Via interconnects are formed between conductor planes by filling a hole therebetween with conductive material.

14 Claims, 2 Drawing Figures

METHOD OF FABRICATING HIGH DENSITY ELECTRONIC CIRCUITS HAVING VERY NARROW CONDUCTORS

BACKGROUND OF THE INVENTION

The present invention relates to conductive circuits and, more particularly, to novel high density electronic circuits having very narrow conductors arranged in at least one plane therein, and to novel methods for fabricating the very narrow conductors of the circuit.

Many electronic circuits utilize a "sandwich" arrangement having layers of thick film conductors with insulative layers spaced therebetween, to provide a means of interconnecting the various electronic components, including integrated circuits and discrete electronic components, of the circuit. Present technology utilizes screen printing of a mask pattern to define the conductive paths, and the interlayer via connections between conductive paths in the various planes. Presently, line widths less than about 4 milli-inches can not practically be provided with screen printing techniques, thereby establishing an upper limit on the density of circuit interconnects. In devices such as hybrid circuit modules, optoelectronic displays and similar electronic circuits which require a high interconnect density, but which are not amenable to integrated circuit manufacturing techniques, the present interconnect density imposes severe restraints on attempts to reduce the size and increase the complexity thereof. It is highly desirable to provide a method whereby electronic circuits may be provided with extremely narrow conductors, and very narrow spacing therebetween, to realize circuitry having an increased interconnect density and allowing size reduction and increased complexity.

BRIEF SUMMARY OF THE INVENTION

In accordance with the invention, a high density electronic circuit, having very narrow conductors with very small spacing therebetween, utilizes an insulative substrate in which is fabricated a pattern of channels, each corresponding to the location of one conductor in the plane defined by the insulative substrate surface. Each channel is filled with a conductive material. A layer of a thick film dielectric material is fabricated upon the conductor-bearing insulative substrate top-surface. Additional channels may be fabricated into that insulative layer surface furthest from the substrate, and each channel is filled with conductive material to provide an additional plane of conductors. Further insulative thick film layers may be provided one atop another, with patterns of channels being fabricated into each insulative layer top surface to contain other planes of conductive paths. Via interconnection between conductive paths of each of the at least one layer of conductor is formed by fabrication of a hole, as by laser machining and the like, from a starting conductive path in an upper layer, through any intervening insulative layers, to a terminating conductive path in a lower layer; the interconnect via hole so formed is filled with conductive material to complete the inter-layer interconnect.

In one presently preferred embodiment, wherein laser machining is utilized to cut the channel into the substrate surface and the surface of at least one insulative layer, line widths and line-to-spacings of less than two milli-inches have been realized for circuit conductors.

Accordingly, it is one object of the present invention to provide a novel method for fabrication of very narrow conductors in high density electronic circuits.

Another object of the present invention is to provide novel high density electronic circuits having very narrow conductors arranged in at least one plane therein.

These and other objects of the present invention will become apparent upon consideration of the following detailed description when read in conjunction with the drawings.

DETAILED DESCRIPTION OF THE INVENTION

Figure 1:
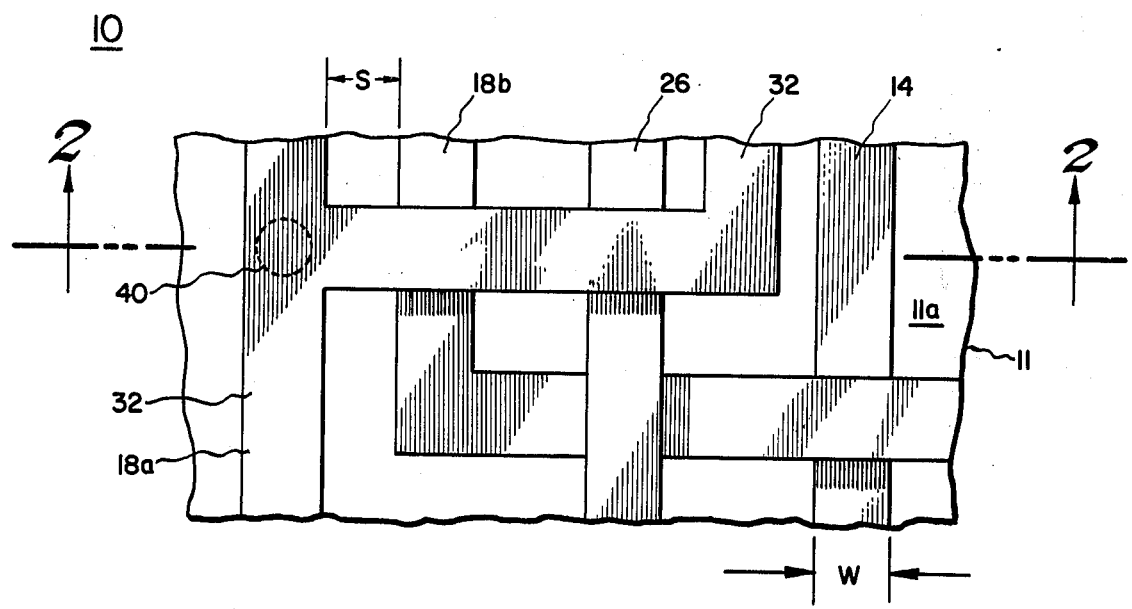
FIG. 1 is a plan view of a portion of a high density electronic circuit having very narrow conductors fabricated in accordance with the principles of the present invention.
Figure 2:
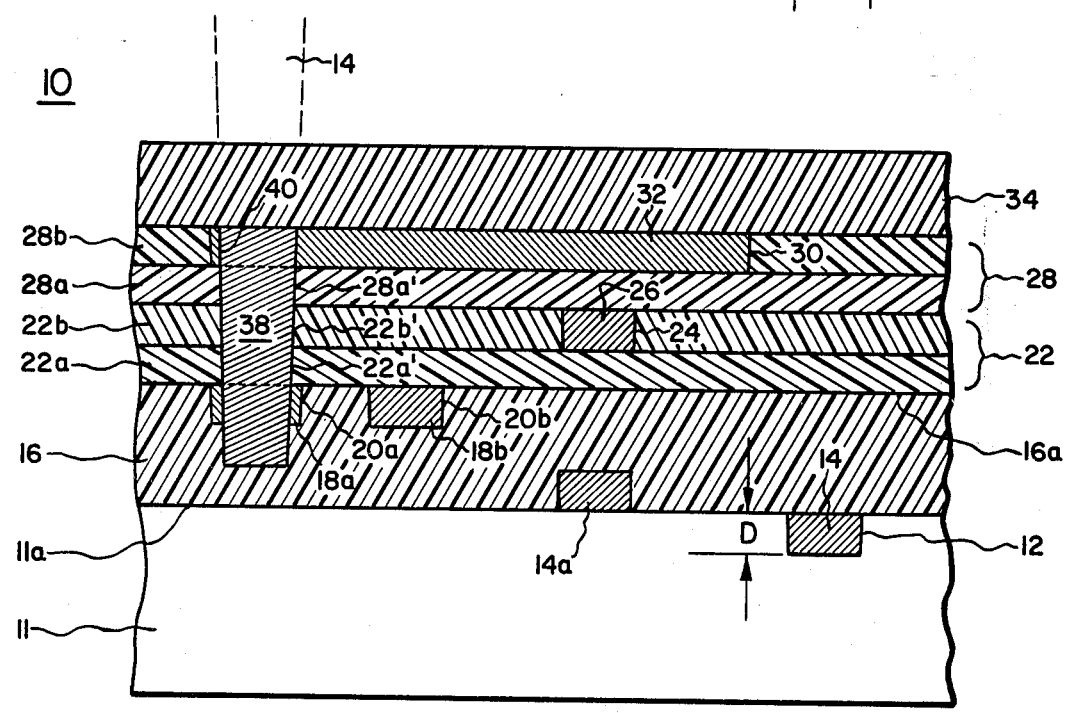
FIG. 2 is a side sectional view of the portion of the circuit of FIG. 1, taken along the line of arrows 2—2.

Referring to the Figures, a portion 10 of a high density electronic circuit is fabricated upon a substrate 11 formed of any desirable insulative material, such as ceramic, epoxy (or other printed circuit board material) and the like. Channels 12 are cut into the top surface 11a of the substrate, as by laser machining and the like, in the pattern required for a first layer of circuit conductors. Each channel may have a minimum width W of less than two milli-inches; the depth D to which the groove is fabricated into the top surface of the substrate is established by the energy, and duration of application thereof, of the impinging laser beam 14.

After the conductor channels 12 in the level of the first plane are fabricated through top surface 11a and into substrate 11, each channel is filled with conductive material 14. Presently, I prefer to utilize a conductive paste material which is subsequently fired in manner similar to the firing of conventional thick film conductors. After the conductor material is filled into the associated channels, excess conductor material remaining on substrate surface 11a is removed, as by lightly lapping the substrate surface. A pattern of conductor lines thus fabricated is embedded in the surface of the substrate.

While even a single level of patterned circuit conductors can be made, by the above technique, with greater density than hitherto possible with screen printing and the like techniques, highly complex circuits can be fabricated by utilizing a plurality of conductor levels. The base may be the substrate 11 with conductors 14 embedded therein, if a substrate of machinable material is used; if a relatively non-machinable material is used, the first level conductors 14a may be fabricated upon the substrate top surface 11a, by conventional thickfilm and the like techniques. A layer 16 of a thick film dielectric material is fabricated upon substrate top surface 11a, and completely covers that surface and either the conductors 14 embedded therein or the conductors 14a fabricated thereon. If conductors 14a are used, the layer surface 16a may have to be lapped to reduce excess dielectric material until a desired degree of smoothness of the layer surface 16a is obtained. A second level of conductors, containing e.g. conductors 18a and 18b, is fabricated by forming appropriately-placed channels 20a and 20b through the top surface 16a, and partly through the thickness, of insulative layer 16. Each of channels 20a and 20b are then filled with a conductive material to form associated conductors 18a and 18b. The spacing S, between conductors in the same level, may be less than 2 milli-inches. Again, the insulative layer top surface 16a may be lapped to remove excess conductor material after the fixing thereof. Additional layers of dielectric, each having conductive-material-filled channels formed through the top surface and into the thickness thereof, can be built up successfully upon the top surface of the layer immediately therebeneath. The depth to which each of the channels 20 is formed is, as previously mentioned, a function of the energy and dwell time of the machining laser beam 14.

To provide uniform depth of each channel, each insulative layer may consist of a first thick film dielectric sublayer 22a, fabricated of a material which is not easily removed by the machining entity. e.g. the impinging laser beam. A second thick film sublayer 22b, of a more easily removed dielectric material, is then fabricated upon the underlying first sublayer 22a. The impingent laser beam cuts the associated channel, e.g. channel 24, through the more easily-removed material of sublayer 22b and does not substantially remove material from the underlying material sublayer 22a. Thereafter, channel 24 is filled with conductive material to provide another, e.g. third, level of circuit conductors. Additional layers such as a fourth layer 24, may also have a first sublayer 24a of relatively hard-to-remove material, underlying a second sublayer 24b of relatively easily removed material. A channel 30 is formed in upper sublayer 20ab and conductive material placed therein to form the circuit conductors e.g. circuit conductor 32, of the next, e.g. fourth, circuit conductor, level.

After fabrication of the required number of circuit conductor levels, a top thick film layer 34 may be fabricated to protect the circuit conductors of the uppermost, e.g. the fourth, level of circuit conductors 32 of the illustrative embodiment. As will be seen in FIG. 1, wherein all of the insulative layers 16, 22, 28 and 34 are shown as transparent, the various conductors 14, 18a and 18b, 26 and 32, in the various levels, can be so positioned to occupy different points along the same vertical plane, without short-circuit being established therebetween.

It is often necessary to interconnect the circuit conductors lying in a plurality of different levels. This can be accomplished by leaving a void, or a hole, in each subsequent layer and/or sublayer, with the voids in registration with one another, whereby an interlayer via is formed. Thus, interconnection between conductor 18a (on the second level) and conductor 32 (on the fourth level) can be facilitated by forming each of a plurality of registered holes, 22a', 22b' and 28a', respectively, in each of the sequentially-fabricated and respective associated layers 22a, 22b and 28a, prior to filling the via hole with conductive material, as conductor 32 is fabricated. However, I have found it to be more convenient, in view of problems in obtaining the necessary small diameter holes in registration with one another during the fabrication of the various layers, to form a hole into the top surface of the top layer 28, to a preselected depth, by increasing the power, or the number, of pulses of beam 14. One manner by which the via may be laser-drilled is described by Cocca and Dakesian, in "Laser Drilling of Vias in Dielectric for High Density Multilayer Thick Film Circuits," *Solid State Technology*, September 1978. Thus, after fabrication of the four-layer circuit illustrated in the Figures, beam 14 is positioned at the desired location and utilized to form a hole 40 (shown in broken line in FIG. 1) through: the conductive material of fourth-level conductor 32 at which the via starts; the underlying sublayers 28a and 28b; the sublayers 28a and 22b thereunder; and at least to the surface of, if not partially or completely through, the second-level conductor 18a at which via terminates. In this manner, automatic registration is achieved. Hole 40 is now completely filled with conductive material 38 and subsequently processed, as by firing and the like, to form a conductive interlayer via between second layer conductor 18a and fourth layer conductor 32. Advantageously, interlayer via 38 is constructed before top layer 34 is applied, whereby the top layer also provides protection to the upper surface 38a of the interconnect vias. It will be seen that vias between conductors in intermediate layers can be fabricated when the upper-most layer of the involved conductor layers is itself fabricated, by forming the vias home at the same time that the upper-most involved layer conductor channels are themselves formed, and thereafter filling the vias with conductive material at the same time as the upper-most involved layer channels on themselves filled.

In one test embodiment, conductive lines between 1.5 and 2.5 milli-inches wide and 0.75 inches long have been realized with 100 percent yield utilizing standard thick film dielectric materials, and with conductor resisitivities essentially equal to that of conductive lines fabricated in conventional fashion and using the same conductive material pastes.

There has just been described my novel high density electronic circuits having very narrow conductors and the methods for fabrication thereof to provide: increased circuit density due to decreased line widths; simplification of hybrid circuit construction due to the greatly reduced alignment requirements, relative to a screen printing process; elimination of the formation of "bumps," which occur in conventional multilayer-hybrid circuits due to the application of dielectric layers over raised conductive line patterns, (which bumps do not occur as each conductor level in my described process has an essentially flat surface after conductor firing and lapping); and increased facility for automation and reduced design cycle time, because all conductive paths may be provided by computer-aided design, which may be subsequently and directly reduced to the required control sequence for an automated laser cutting system, to produce the high density electronic circuit itself.

While the present invention is described with reference to one presently preferred embodiment, many variations and modifications will now become apparent to those skilled in the art. It is my intent, therefore, to be limited only by the scope of the appending claims and not by the specific details provided herein by way of description.

What is claimed is:

1. A method for fabricating a conductive circuit for interconnecting a plurality of locations, comprising the steps of:

providing an insulative material substrate, having a first surface;

fabricating by laser machining at least one channel into said substrate through said first surface;

positioning each of the at least one channel to interconnect preselected ones of the plurality of locations;

filling the at least one channel with conductive material to provide at least one conductor each interconnecting preselected locations;

fabricating a first solid sublayer of an insulative and relatively non-laser-machineable material upon said substrate first surface;

fabricating a second solid sublayer of an insulative and relatively laser-machineable material upon that surface of said first sublayer furthest from said substrate;

fabricating by laser machining at least one other channel at least partially through the thickness of only said second sublayer;

filling the at least one other channel with conductive material to provide at least one other conductor each interconnecting other preselected locations; and so positioning the at least one other channel as to insulate the additional conductor material therein from the conductive material in the at least one channel.

2. The method of claim 1, further comprising the steps of: sequentially fabricating at least one additional insulative material layer upon the surface of the second sublayer closest to the substrate, each of the at least one additional layer being fabricated by first fabricating a first solid sublayer of an insulative and relatively non-laser-machineable material, closest to the substrate, and then fabricating a second solid sublayer of an insulative and relatively laser-machineable material upon the first sublayer and furthest from the substrate; forming by laser machining at least one additional channel at least partially through the thickness of only the second sublayer of an associated one of the at least one additional layer; positioning the at least one additional channel to interconnect additional preselected ones of the locations, in manner insulated from all other channels; and filling the at least one additional channel with conductive material, to conductively interconnect the preselected additional locations.

3. The method of claim 1 or 2, further comprising the step of connecting at least one channel of each of a plurality of the substrate and the totality of layers to form a via therebetween.

4. The method of claim 1 or 2, further comprising the step of fabricating a protective layer upon the first surface of the outermost one of the substrate and totality of layers.

5. The method of claim 1, further comprising the step of finishing the substrate first surface to a substantially smooth finish prior to fabricating the first sublayer thereupon.

6. The method of claim 2, further comprising the step of finishing the surface, furthest from the substrate, of the second sublayer of each of the at least one additional layers to a substantially smooth finish, prior to fabricating the first sublayer of a next subsequent additional layer thereupon.

7. A method for fabricating a conductive circuit for interconnecting a plurality of locations, comprising the steps of:

providing an insulative material substrate, having a first surface;

fabricating a first solid sublayer of an insulative and relatively non-laser-machineable material upon the substrate first surface; the first sublayer having a first surface furthest from the substrate first surface;

fabricating a second solid sublayer of an insulative and relatively laser-machineable material upon the first sublayer first surface;

fabricating by laser machining at least one channel into only the second layer through the second layer first surface;

positioning each of the at least one channel to interconnect preselected ones of the plurality of locations; and filling the at least one channel with conductive material to provide at least one conductor each interconnecting preselected locations.

8. The method of claim 7, further comprising the steps of: fabricating at least one other conductor upon the substrate first surface; and positioning the at least one other conductor to interconnect other preselected ones of the plurality of locations and be insulated from the at least one conductor.

9. The method of claim 7 or 8, further comprising the step of: sequentially fabricating at least one additional insulative material layer upon the first surface of the second sublayer, with each of the at least one additional layer being fabricated by first fabricating a first solid sublayer of an insulative and relatively non-laser-machineable material, closest to the substrate, and then fabricating a second solid sublayer of an insulative and relatively laser-machineable material upon the first sublayer and furthest from the substrate; forming by laser machining at least one additional channel at least partially through the thickness of only the second sublayer of an associated one of the at least one additional layer; positioning the at least one additional channel to interconnect additional preselected ones of the locations, in manner insulated from all other channels; and filling the at least one additional channel with conductive material, to conductively interconnect the preselected additional locations.

10. The method of claim 9, further comprising the step of connecting at least one channel of each of a plurality of the substrate and the totality of layers to form a via therebetween.

11. The method of claim 9, further comprising the step of fabricating a protective layer upon the first surface of the outermost one of the substrate and totality of layers.

12. The method of claim 7 or 8, further comprising the step of fabricating a protective layer upon the first surface of the outermost one of the substrate and totality of layers.

13. The method of claim 8, further comprising the step of: finishing the first sublayer surface furthest from said substrate to a substantially smooth finish prior to fabricating the second sublayer thereon.

14. The method of claim 11, further comprising the step of: finishing the surface furthest from the substrate of the second sublayer of each of the at least one additional layer to a substantially smooth finish, prior to fabricating the next successive additional layer thereupon.

* * * * *